United States Patent [19]

Sekiya

[11] Patent Number: 4,625,463
[45] Date of Patent: Dec. 2, 1986

[54] WAFER ATTRACTING AND FIXING DEVICE

[75] Inventor: Shinji Sekiya, Tokyo, Japan

[73] Assignee: Disco Co., Ltd., Tokyo, Japan

[21] Appl. No.: 708,626

[22] Filed: Mar. 6, 1985

Related U.S. Application Data

[62] Division of Ser. No. 265,318, May 20, 1981, Pat. No. 4,521,995.

[30] Foreign Application Priority Data

May 23, 1980 [JP] Japan ................. 55-0684471
May 23, 1980 [JP] Japan ................. 55-071025[U]

[51] Int. Cl.[4] .................................. B24B 41/06
[52] U.S. Cl. ......................... 51/216 R; 51/235; 51/323; 51/131.5
[58] Field of Search ............. 51/283 R, 323, 235, 51/216 R, 216 LP, 216 T, 131.5

[56] References Cited

U.S. PATENT DOCUMENTS 3,860,399 1/1975 Noble et al. ............. 51/216 LP
3,948,007 4/1976 Feneberg et al. ............. 51/284

FOREIGN PATENT DOCUMENTS 2327583 12/1974 Fed. Rep. of Germany ........ 51/235
43863 11/1972 Japan ........................ 51/235
155494 12/1977 Japan ........................ 51/235

Primary Examiner—Frederick R. Schmidt
Assistant Examiner—Debra S. Meislin
Attorney, Agent, or Firm—Flynn, Thiel, Boutell & Tanis

[57] ABSTRACT

A work head for attracting and fixing an IC silicon wafer is comprised of an attracting disc and a base seat surrounding the periphery of the attracting disk. The attracting disc is of an inorganic substance shaped and sintered so that the upper layer of the attracting disc is composed of a porous body of porous grain and the lower layer the attracting body is formed with a slightly coarse body of porous grain.

The base seat is made airtight being formed and sintered with the same substance as the attracting disc. The attracting disc and the base seat are coupled with glass having a low melting point. The attracting disc is connected to a connecting hole drilled through the base seat and further to a water injecting hole and air sucking hole of a lower base. Before the wafer is attracted, water is injected from the injection hole for soaking the attracting surface. The surface tension of water transfers the wafer to the center of the attracting surface. Hereafter, the wafer is attracted onto the attracting surface by sucking air out. After the working, water is injected again for floating the wafer.

6 Claims, 11 Drawing Figures

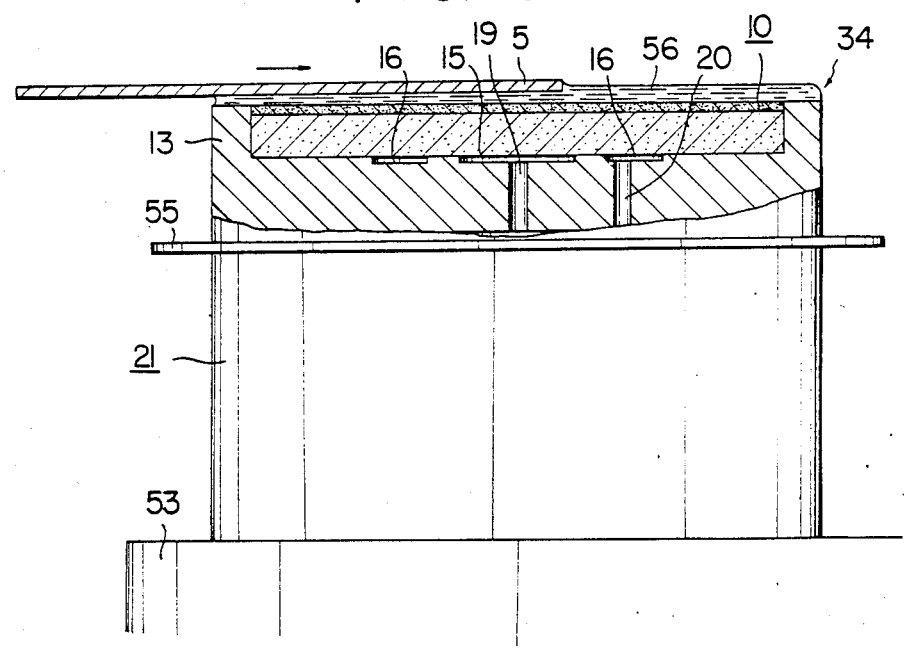

WAFER ATTRACTING AND FIXING DEVICE

This is a division of application Ser. No. 265,318 filed May 20, 1981, now U.S. Pat. No. 4,521,995.

BACKGROUND OF INVENTION

The present invention relates to an attracting and fixing device for attracting and fixing a silicon wafer to a work head by air sucking in.

The surface of the silicon wafer on which an IC circuit is made is precisely ground, cut or measured with accuracy in the unit of μm. In this case the silicon wafer is attracted and fixed on the work head by air sucking action. As the fixing method, methods shown in FIGS. 1 and 2 have been conventionally employed, wherein many circular slots in concentric circles are formed on the upper surface of the working base (1). The circular slots are connected with radial connecting slots. The silicon wafer (5) is sucked from an air conditioning hole (4) at the center for fixing it as shown in FIG. 1, or as the work head, an attracting disc of porous substance (6) is utilized. The periphery of it is surrounded with a base seat (7) of metal or synthetic resin with no permeability. Air sucking is performed through the air conducting hole (4) at the center for fixing the wafer as shown in FIG. 2.

According to the method shown in FIG. 1, an air gap is caused between the silicon wafer (5) and the attracting surface due to slots (2), (3).

If sucked heavily or pressed from the above when the wafer is ground and worked, the wafer is distorted locally causing error in cut size, or it becomes uneven when air is sucked out after working.

For example, when grinding a thin wafer of 0.1-0.5 mm (0.1 to 0.5 mm) thick the wafer is sucked heavily and pressed down by a rotary grindstone (8) from above. Therefore, it is curved downward at portions of slots (2), (3). If the wafer is so pressed down during grinding, when the pressure is released, only the portions facing to the slots expand.

This cannot be neglected in the wafer grinding in which an accuracy within ±5 μm is required.

In a method shown in FIG. 2, the porous attracting disc (6) is composed of a substance having large pores for passing air and cleaning water. Therefore it has defects that it is clogged by dust of the grindstone, causing insufficient sucking and cleaning.

Further, in FIG. 2 the porous attracting disc (6) is necessarily surrounded by the base seat (7) made of material with no porosity.

If the base seat (7) is of metal, as the substance composing the attracting disc (6) and that composing the base seat are different from each other, the attracting disc (6) is probably distorted or peeled off from the base seat (7). Furthermore the method shown in FIG. 2 is defective in that, when the attracting disc (6) is ground, the upper layer of the base seat (7) is also ground, therefore the grindstone and the edged tool are damaged.

In the case that the base seat is made of synthetic resin, the grindstone and the edged tool are not damaged at the time of grinding, however, when the attracting disc (6) is joined with the base seat (7), it is likely that the adhesive resin comes up to the attracting surface through the interior of the porous attracting disc (6), or the attracting surface becomes uneven or distorted due to the difference of the expansion coefficient between the attracting disc and the base seat.

BRIEF SUMMARY OF INVENTION

An object of the present invention is to provide a wafer attracting and fixing device which can be used for a long time without clogging in case of attracting and fixing a silicon wafer to the attracting disc. According to the present invention, to achieve this object, the upper layer of the attracting disc is made of a substance having fine pores, the lower one being made of a substance of coarse pores. Consequently, the disc resists being clogged with cutting chips, dust, and so forth. Further it is scarcely affected by the sucking action.

Another object of the present invention is to provide the wafer attracting and fixing device in which the combination of the attracting disc and a base seat is made more reliable than the conventional one. For achieving this object, in the present invention, the attracting disc and the base seat are formed with the same inorganic substance. These are adhered each other with glass with a low melting point. As the result, the attracting disc and the base seat have the same thermal expansion coefficient preventing deformation and peeling.

Another object of the present invention is to provide a device in which the silicon wafer can be easily located by the surface tension of water. According to the present invention water is sent pressurized from the base seat side, being spouted out slowly onto the surface of the attracting disc for making a water film. The wafer put on the water film is transferred to the center of the attracting disc by the surface tension of water. It is necessary that the attracting disc is a disc like body having a nearly same diameter as that of the wafer which is light.

The other object is to provide a device in which the work head composed of the attracting disc and the base seat can be fixed to a lower base simply and interchangeably. The silicon wafer as a work piece can have any diameter which is one of various diameters normally ranging from 2 inch to 6 inch in every half inch. Therefore, work heads having different diameters of attracting disc must be simply interchanged on the lower base. In the present invention, the work head is fixed by magnets in the vertical direction and the movement of it in the horizontal direction is regulated by coupling a notch and a projection.

Other objects and features of the present invention will be obvious from the description given hereafter.

DESCRIPTION OF DRAWING

FIG. 9 is the sectional view showing a state in which a piece to be worked is being translated by the surface tension of water.

Hereinafter, an embodiment of the present invention will be described basing on the drawings shown in FIGS. 3, 4, 5, 6, 7, 8, and 9.

Figure 1:
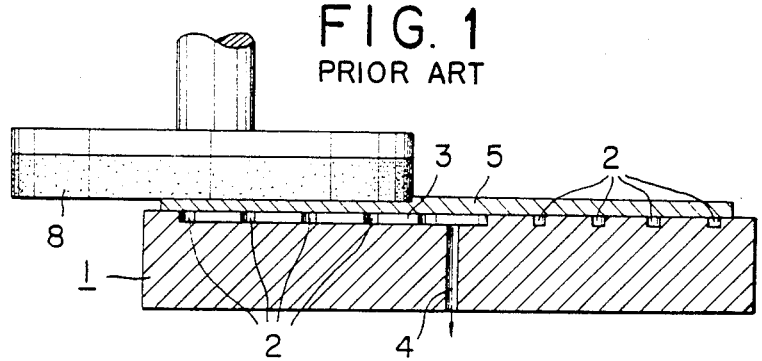
FIG. 1 is a sectional view showing a conventional attracting disc with ring like slots.
Figure 2:
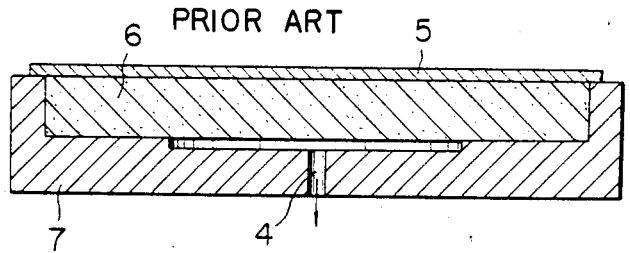
FIG. 2 is a sectional view showing a conventional attracting disc of a porous inorganic substance.
Figure 3:
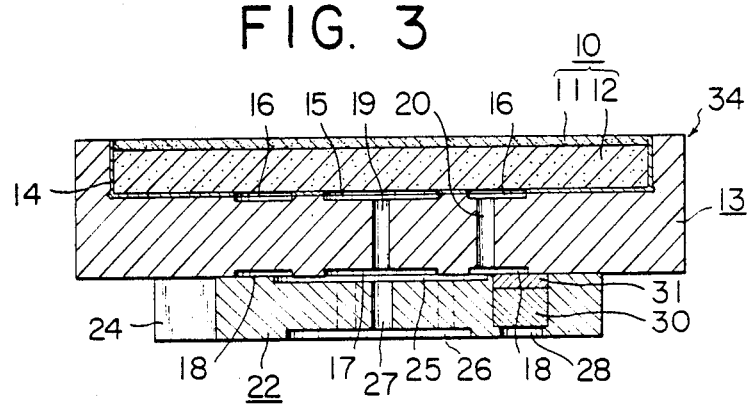
FIG. 3 is a sectional view of the work head according to the present invention.
Figure 4A:
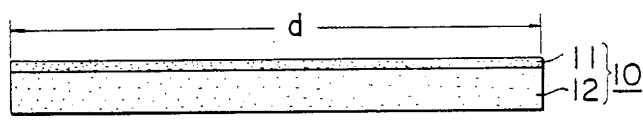
FIGS. 4a, 4b and 4c are sectional views of the respective composing portions of the work head shown in FIG. 3.

In FIG. 4a the numeral (10) shows an attracting disc in which a porous upper layer with fine pores (11) and a porous lower layer with pores that are a little coarse are joined together and sintered. The attracting disc (10) is one of these which are prepared to have a little smaller diameter than that of the silicon wafer (5) (9 kinds ranging from 2" to 6" in every half inch) as the work piece.

The upper layer (11) of fine alundum grindstone powder, for example, of #40 and/or #60 grades for making the porosity small and the lower layer (12) of coarse grindstone powder such as of #20 grade for making the porosity large are joined together and sintered. Then, the attracting disc (10) is now formed as a unit which has the upper layer (11) of nearly 2 mm thick and the lower layer (12) of nearly 8 mm joined together.

Figure 4B:
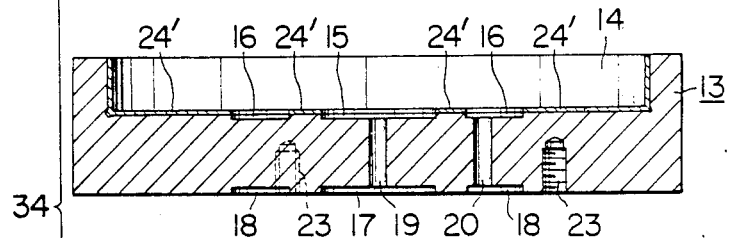
Figure 5:
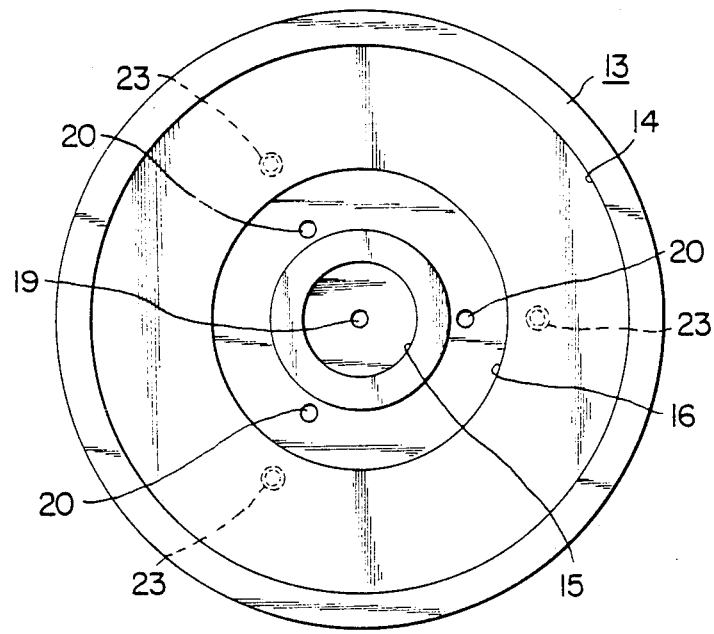
FIG. 5 shows the plan view of the base seat shown in FIG. 4b.

In FIGS. 4b and 5, the numeral (13) shows a base seat into which said attracting disc (10) is fitted. A hollow portion (14) in the base seat (13) is formed with one inside diameter of various ones corresponding to the outer diameters for said attracting disc (10) for fitting. Also, the base seat (13) is made of the same substance as that of the attracting disc (10), for example, alundum grindstone powder of extremely fine grade such as of (#600) sintered for making the base seat non porous.

On the inner and outer surfaces of the hollow (14) of the base seat (13), shallow slots (15), (16), (17) and (18) are respectively formed at the central portion and on its periphery. The shallow slots (15) and (17), and (16) and (18) are respectively in communication up and down through the connecting holes (19) and (20).

On the lower surface of the base seat (13), holes for set screws are provided for a fitting disc (22) to the lower base (21) described later. For fixing the attracting disc (10) to the base seat (13), glass powder (24') with a low melting point is put on the inner wall of the hollow (14) except the shallow slots (15), (16). Onto the glass powder coated base seat, the attracting disc (10) is fitted pressurized, and then these are heated at the predetermined temperature for the glass powder to be melted. Thus, these are joined by so called hermetic seal method.

Figure 4C:
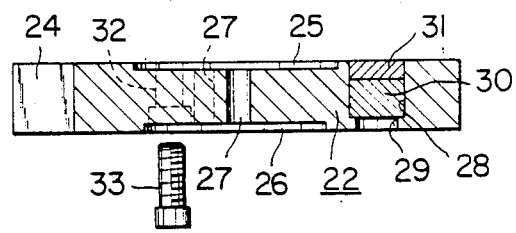
Figure 6:
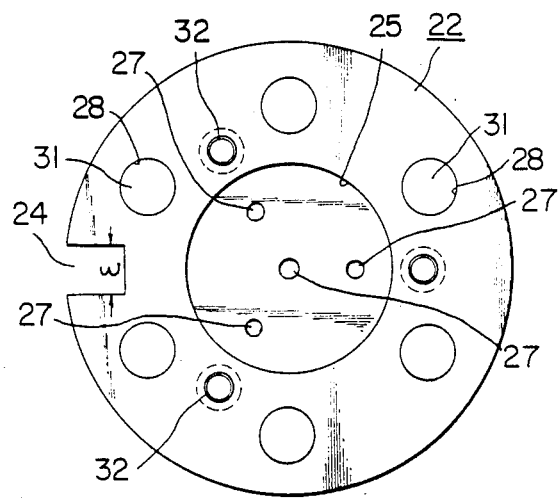
FIG. 6 is the plan view of a coupling disc.

Said fitting disc (22) has its thickness and diameter regulated accurately as shown in FIGS. 4c and 6. At a point of the outer periphery of the disc a notch (24) is formed with an accurate width (w). Shallow slots (25), and (26) are formed on the upper and lower surface respectively. Connecting holes (27) are provided by drilling at the central portion and three places surrounding it for connecting the upper surface to the lower one. Magnet accommodating holes (28) are formed along the periphery of shallow slots (25) and (26) at the angular interval of 60° with a magnet holding step (29) at a portion. Within the magnet accommodating hole (28), a magnet (30) is accommodated and fixed with a spacer (31). The numeral (32) shows holes for screws (33) by which the fitting disc (22) and said base seat (13) are fixed as a single body. Thus, the work head (34) is formed with the attracting disc (10), the base seat (13) and the fitting disc (22). The attracting surface the work head is coated with a comparatively soft and thin plastic film (for example, of a few μm-some hundred μm) adhered or sprayed, as required. In this case, many small pores are formed through the film or the coat for the attracting action not to be interfered with.

Figure 7:
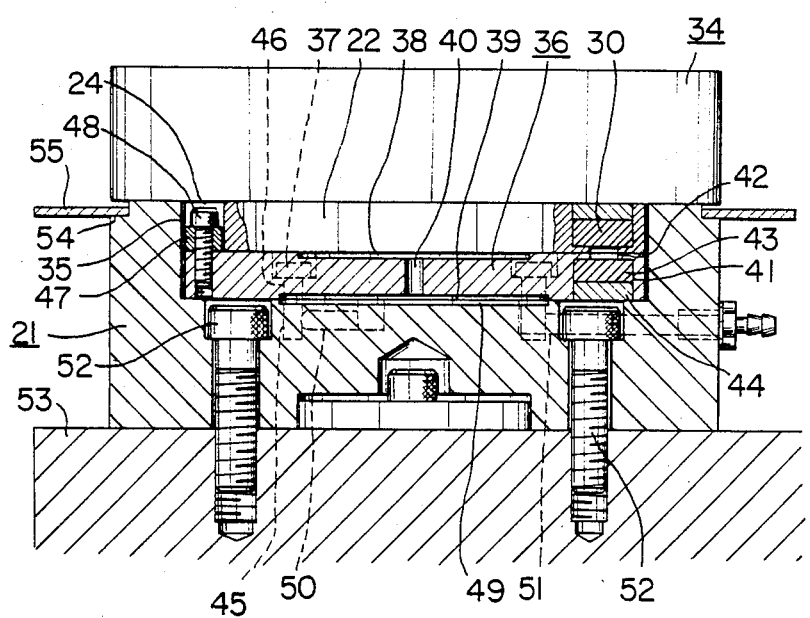
FIG. 7 is a central sectional view of the lower base.
Figure 8:
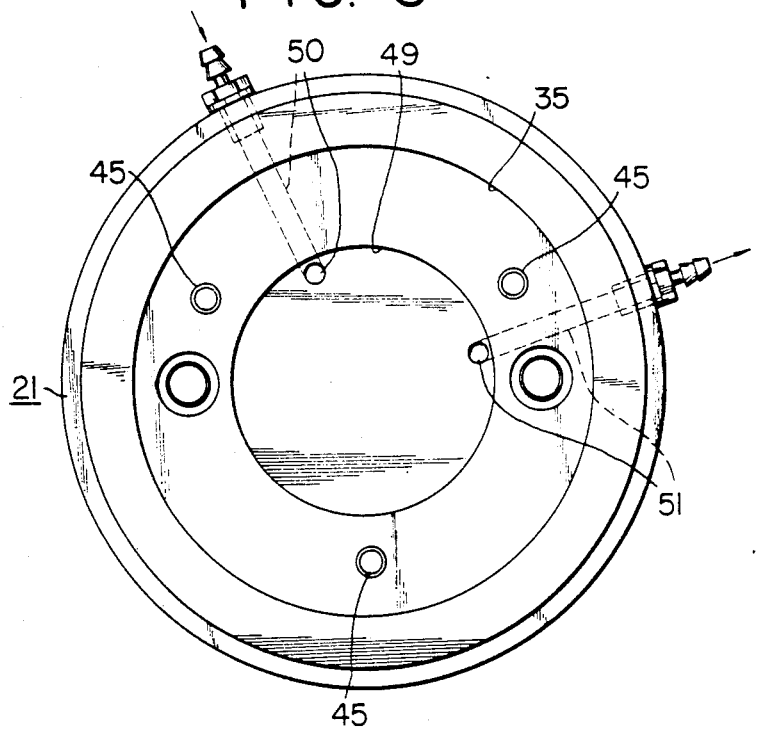
FIG. 8 is the plan view of the lower base shown in FIG. 7.

In FIGS. 7 and 8, the lower base (21) has a nearly the same diameter as that of said work head (34). A hollow portion (35) having such a diameter that said fitting disc (22) can be fitted is formed on the upper surface. A disc (36) formed nearly the same as the fitting disc (22) is fixed to the hollow portion (35) by a screw (37). The disc (36) has shallow slots (38) and (39) formed on the central upper and lower surfaces and a connecting hole (40) drilled at the center. Around the shallow slots (38), (39) magnet accommodating holes (41) are drilled at the angular interval of 60° with a magnet holding step (42). A magnet (43) is accommodated in the magnet accommodating hole (40) with a spacer (44). A hole for the screw (46) is drilled in accord with the hole for screw (45) of the lower base (21) for fixing the disc with a screw (37). The disc (36) is different from said fitting disc (22) in that a collar (47) having the same diameter as said width (w) acts as a coupling projection coupling to the notch (24), is fixed with a screw (48) to the disc (36). A cleaning water injecting hole (50) and an air sucking hole (51) are drilled from a shallow slot (49) on the contact surface with the shallow slot (39) of the disc (36) to the side surface on the lower base (21). The lower base (21) is fixed to a driving base (53) with screws (52). On a notch portion (54) along the periphery on the upper and of the lower base (21) an upward forcing plate (55) is fitted for forcing up the work head (34) to remove it.

In such a composition shown above, after selecting a work head (34) having an attracting disc (10) with a suitable diameter for the purpose, the fitting disc (22) on the lower surface of the work head (34) is fitted into the hollow portion (35) of the lower base (21) and rotated right and left, when the notch (24) and the coupling projection (47) coincide, the fitting disc (22) sinks further, and the upper and lower discs (22) and (36) are fixed in close contact by the attraction of the upper and lower magnets (30) and (43).

In this state, as shown in FIG. 9 water sent pressurized from the cleaning water injecting hole (50) is spouted out slowly onto the surface of the attracting disc (10) through the shallow slots (39), (49), the connecting hole (40), the shallow slots (26), (38), the connecting hole (27), the shallow slots (17), (18), (25), the connecting holes (19), (20), and the shallow slots (15), (16) for forming a water layer (56) by the surface tension of water. At this time, if a silicon wafer (5) is put on the water layer, it is transferred to a nearly central position of the attracting disc as shown by an arrow, being stopped and set in position. If sucked from an air sucking hole (51), water and air are sucked out, and the wafer (5) is attracted and fixed to the attracting disc (10). Then the treatments such as grinding by a rotary grindstone (8), cutting for making slots and so forth is performed.

After the treatment, if the sucking is stopped, and water is sent again from the cleaning water injecting hole (50), then the wafer (5) floats up from the attracting disc (10), being sent to the next cleaning process.

The attracting force between magnets (30) and (43) should be set so that when water is sent pressurized from below for floating up the wafer (5) after the treatment is complete, the working base may not float up and still the magnets may separate comparatively easily from each other when the work head is interchanged with another.

In the embodiment described above, to each of the fitting disc (2) and the disc (33), the magnets (30) and

(43) are fixed, however, one of these magnets may be replaced with a magnetic body.

What is claimed is:

1. A method for transferring a nearly circular wafer to the substantially center position of the surface of a nearly circular disc of similar diameter, said method comprising forming a water layer on said surface of said disc, laying the wafer on the water layer, and transferring the wafer to the center position of said disc by use of the surface tension of the water layer.

2. A method for automatically centering a wafer atop the surface of a disc, comprising:

providing a disc of substantially the same lateral size and shape as the wafer to be centered thereon;

flooding the bare top surface of the disc with sufficient water to extend a water layer over substantially the full width of said disc surface by the surface tension of the water;

thereafter placing a wafer atop the water layer without regard to centering of the wafer with respect to the disc;

releasing the wafer and therewith using the surface tension of said water layer to center the wafer with respect to the disk.

3. The method of claim 2 wherein said disc is porous, the step of forming a water layer on said surface including supplying water from the bottom of said disc and making the water slowly spout out onto said surface.

4. The method of claim 3 including surrounding the periphery of said disc by a nonporous base seat with the diameter of said disc being a little smaller than that of the wafer and the outer diameter of said base seat being a little bigger than the diameter of the wafer and said surface of said disc and the upper surface of said base seat being substantially on the same level and wherein said flooding step includes extending the water layer over the upper surface of base seat.

5. The method of claim 4, including attracting and fixing the wafer on said surface by sucking air through said disc, performing a treatment of the wafer, stopping the sucking of air, again forming a water layer on said surface and thus floating the wafer up from said surface, removing the wafer from said surface, and putting the next wafer on said surface.

6. The method of claim 2 wherein the wafer is a light weight silicon wafer of thickness less than that of the water layer.

* * * * *